United States Patent
Kitching et al.

(10) Patent No.: US 9,014,647 B2
(45) Date of Patent: *Apr. 21, 2015

(54) METHODS FOR DIRECTIONAL COUPLER TERMINATION IMPEDANCE CONTROL

(71) Applicant: Skyworks Solutions, Inc., Woburn, MA (US)

(72) Inventors: Philip A Kitching, Oak Ridge, NC (US); David K Homol, Kernersville, NC (US); Gary W Sadowniczak, Greensboro, NC (US); Ryan M Pratt, High Point, NC (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/856,723

(22) Filed: Apr. 4, 2013

(65) Prior Publication Data
US 2013/0293316 A1 Nov. 7, 2013

Related U.S. Application Data

(62) Division of application No. 12/844,382, filed on Jul. 27, 2010, now Pat. No. 8,417,196.

(60) Provisional application No. 61/352,330, filed on Jun. 7, 2010.

(51) Int. Cl.
*H04B 1/04* (2006.01)
*H01Q 11/12* (2006.01)
*H03H 11/30* (2006.01)
*H03F 3/72* (2006.01)
*H03F 1/02* (2006.01)

(52) U.S. Cl.
CPC ............... *H03H 11/30* (2013.01); *H03F 3/72* (2013.01); *H03F 1/0261* (2013.01)

(58) Field of Classification Search
USPC .............. 455/107, 126, 127.2, 127.3; 333/109
See application file for complete search history.

(56) References Cited

U.S. PATENT DOCUMENTS

| | | |
|---|---|---|
| 4,701,724 A | 10/1987 | Martin |
| 5,625,328 A | 4/1997 | Coleman, Jr. |

(Continued)

FOREIGN PATENT DOCUMENTS

| | | | |
|---|---|---|---|
| EP | 0742649 A2 | | 11/1996 |
| JP | 2000-165164 | * | 6/2000 |

(Continued)

OTHER PUBLICATIONS

International Search Report and Written Opinion of the International Search Authority in PCT/US2011/039332, dated Jan. 5, 2012, 9 pages.

*Primary Examiner* — Nguyen Vo
(74) *Attorney, Agent, or Firm* — Knobbe, Martens, Olson & Bear, LLP

(57) ABSTRACT

Methods for directional coupler termination impedance control are provided. In one embodiment, a method for termination impedance selection of a directional coupler in a power amplifier module is provided. The method includes determining at least one of a power mode or a frequency band of operation of the power amplifier module. The method further includes selecting a termination impedance of the directional coupler based on the determination using at least one switch.

20 Claims, 10 Drawing Sheets

(56) References Cited

U.S. PATENT DOCUMENTS

| | | |
|---|---|---|
| 6,329,880 B2 | 12/2001 | Akiya |
| 8,175,554 B2 | 5/2012 | Camuffo et al. |
| 8,417,196 B2 | 4/2013 | Kitching et al. |
| 2004/0203552 A1* | 10/2004 | Horiuchi et al. ............ 455/333 |
| 2005/0239421 A1* | 10/2005 | Kim et al. .................... 455/126 |
| 2010/0102898 A1* | 4/2010 | Wren ............................ 333/116 |
| 2011/0057746 A1* | 3/2011 | Yamamoto et al. .......... 333/116 |

FOREIGN PATENT DOCUMENTS

| | | |
|---|---|---|
| JP | 2005-184631 A | 7/2005 |
| KR | 10-0737539 B1 | 7/2007 |

\* cited by examiner

US 9,014,647 B2

METHODS FOR DIRECTIONAL COUPLER TERMINATION IMPEDANCE CONTROL

CROSS-REFERENCE TO RELATED APPLICATIONS

The present application is a divisional of U.S. application Ser. No. 12/844,382, filed Jul. 27, 2010, titled "APPARATUS AND METHOD FOR DIRECTIONAL COUPLING," which claims the benefit of priority under 35 U.S.C. §119(e) of U.S. Provisional Patent Application No. 61/352,330, filed Jun. 7, 2010, titled "Circuits & Systems," the disclosures of each of which are hereby incorporated by reference in their entireties herein.

BACKGROUND

1. Field

Embodiments of the invention relate to electronic systems and, in particular, to radio frequency (RF) directional couplers.

2. Description of the Related Art

RF power amplifiers can be used to boost the power of a RF signal having a relatively low power. Thereafter, the boosted RF signal can be used for a variety of purposes, included driving the antenna of a transmitter.

A power amplifier can be included in a mobile phone to amplify a RF signal for transmission. For example, in a mobile phone having a time division multiple access (TDMA) architecture, such as those found in Global System for Mobile Communications (GSM), code division multiple access (CDMA), and wideband code division multiple access (W-CDMA) systems, a power amplifier can be used to shift power envelopes up and down within prescribed limits of power versus time. It can be important manage the amplification of a RF signal, as a particular mobile phone can be assigned a transmission time slot for a particular frequency channel. A power amplifier can be employed to aid in regulating the power level of the RF signal over time, so as to prevent signal interference from transmission during an assigned receive time slot and to reduce power consumption.

One or more directional couplers can be used in a system employing a power amplifier. For example, a directional coupler can monitor and measure the power of a power amplifier output signal to aid in controlling the power amplifier.

There is a need for improved for improved directional couplers in power amplifier systems.

SUMMARY

In certain embodiments, the present disclosure relates to an apparatus including a directional coupler having a first power input terminal, a first power output terminal, a couple terminal and a terminate terminal, the first power input terminal configured to receive a radio frequency signal from a first power amplifier, and the first power output terminal configured to electrically connect to a first load. The apparatus further includes a first termination impedance. The apparatus further includes a first switch having an ON state and an OFF state, the first switch including an input electrically connected to the terminate terminal of the directional coupler and an output electrically connected to the first termination impedance, the first switch configured to provide a relatively low impedance path between the input and the output when in the ON state and to provide a relatively high impedance path between the input and the output when in the OFF state. The apparatus further includes a control block for setting the state of the first switch.

In some embodiments, the first power input terminal is electrically connected to the first power output terminal and the couple terminal is electrically connected to the terminate terminal.

According to a number of embodiments, the apparatus further includes a second termination impedance and a second switch having an ON state and an OFF state, the second switch including an input electrically connected to the terminate terminal of the directional coupler and an output electrically connected to the second termination impedance, the second switch is configured to provide a relatively low impedance path between the input and the output when in the ON state and to provide a relatively high impedance path between the input and the output when in the OFF state, the control block configured to set the state of the second switch.

In various embodiments, the control block is configured to set the first switch in an ON state and the second switch in an OFF state for a first power mode of the apparatus, the control block configured to set the second switch in an ON state and the first switch in an ON state for a second power mode of the apparatus.

In accordance with some embodiments, the directional coupler further includes a second power input terminal and a second power output terminal, the second power input terminal electrically connected to the second power output terminal and configured to receive a radio frequency signal from a second power amplifier, and the second power output terminal configured to electrically connect to a second load.

In certain embodiments, the control block is configured to set the first switch in an ON state and the second switch in an OFF state for a first frequency band of operation, the control block is configured to set the second switch in an ON state and the first switch in an ON state for a second frequency band of operation.

In several embodiments, the first termination impedance includes a resistor.

According to some embodiments, the first termination impedance includes a capacitor.

In a number of embodiments, the capacitor is disposed on a complimentary metal oxide semiconductor (CMOS) die, the capacitor including at least one CMOS transistor.

In various embodiments, the first load is an antenna of a mobile device.

In several embodiments, the first switch is a CMOS switch having a gate, a drain, a source, and a well, the source and drain formed in the well, the gate formed adjacent the well between the source and drain, the source configured to operate as the input of the switch, and the drain configured to operate as the output of the switch.

In a number of embodiments, the well has a p-type doping and the first switch includes an n-well for electrically isolating the well from a substrate.

According to certain embodiments, the apparatus further includes a capacitor having a first end electrically connected to the source of the first switch and a second end electrically connected to the terminate terminal of the directional coupler.

In some embodiments, the apparatus further includes an inductor for biasing the source of the source of the first switch.

In accordance with a number of embodiments, the control block includes a gate bias control block for biasing the gate voltage of the first switch, the gate bias control block configured to bias the gate voltage of the first switch to at least two voltage levels.

In various embodiments, the first switch and the first power amplifier are disposed on separate dies.

In certain embodiments, the present disclosure relates to a method for selecting the termination impedance of a directional coupler in a power amplifier module. The method includes determining at least one of a power mode and a frequency band of operation of the power amplifier module. The method further includes selecting a termination impedance of the directional coupler using at least one switch.

In several embodiments, selecting the termination impedance includes selecting a termination resistor.

According to some embodiments, selecting the termination impedance of the directional coupler using the at least one switch includes using a CMOS switch.

In a number of embodiments, selecting the termination impedance includes selecting a capacitor.

In various embodiments, the method further includes biasing the CMOS switch using an inductor.

In some embodiments, selecting the termination impedance of the directional coupler using the at least one switch includes using at least two switches.

According to several embodiments, the method further includes providing a radio frequency signal from a power amplifier to an antenna of a wireless device through the directional coupler.

In a number of embodiments, the method further includes measuring a power of the radio frequency signal using the directional coupler.

In some embodiments, determining at least one of the power mode and the frequency band of operation of the power amplifier module includes determining the power mode of the power amplifier module.

In accordance with various embodiments, determining at least one of the power mode and the frequency band of operation of the power amplifier module includes determining the frequency band of operation of the power amplifier module.

In certain embodiments, the present disclosure relates to a computer-readable storage medium including instructions that when executed by a processor perform a method for selecting the termination impedance of a directional coupler in a power amplifier module. The method includes determining at least one of a power mode and a frequency band of operation of the power amplifier module. The method further includes selecting a termination impedance of the directional coupler using a switch.

In some embodiments, the present disclosure relates to an apparatus including means for directionally coupling, wherein the means for directionally coupling includes an input terminal, an output terminal, a coupling terminal and a terminate terminal, the input terminal configured to receive a radio frequency signal, and the first power output terminal configured to electrically connect to a load. The apparatus further includes means for terminating the terminate terminal. The apparatus further includes means for switching having an ON state and an OFF state, the means for switching including an input electrically connected to the terminate terminal and an output electrically connected to the means for terminating, the means for switching configured to provide a relatively low impedance path between the input and the output when in the ON state and to provide a relatively high impedance path between the input and the output when in the OFF state. The apparatus further includes means for setting the state of the means for switching.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

The headings provided herein, if any, are for convenience only and do not necessarily affect the scope or meaning of the claimed invention.

Figure 1:
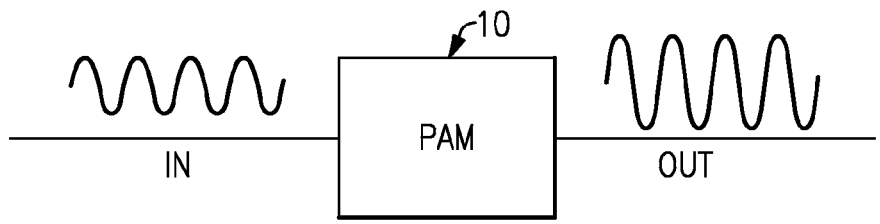
FIG. 1 schematically depicts a power amplifier module for amplifying a radio frequency (RF) signal.

Provided herein are various non-limiting examples of devices and methods for facilitating amplification of a radio frequency (RF) signal. FIG. 1 schematically depicts a power amplifier module (PAM) 10 that can be configured to achieve such an amplification of the RF signal so as to yield an output RF signal. As described herein, the power amplifier module can include one or more power amplifiers (PA).

Figure 2:
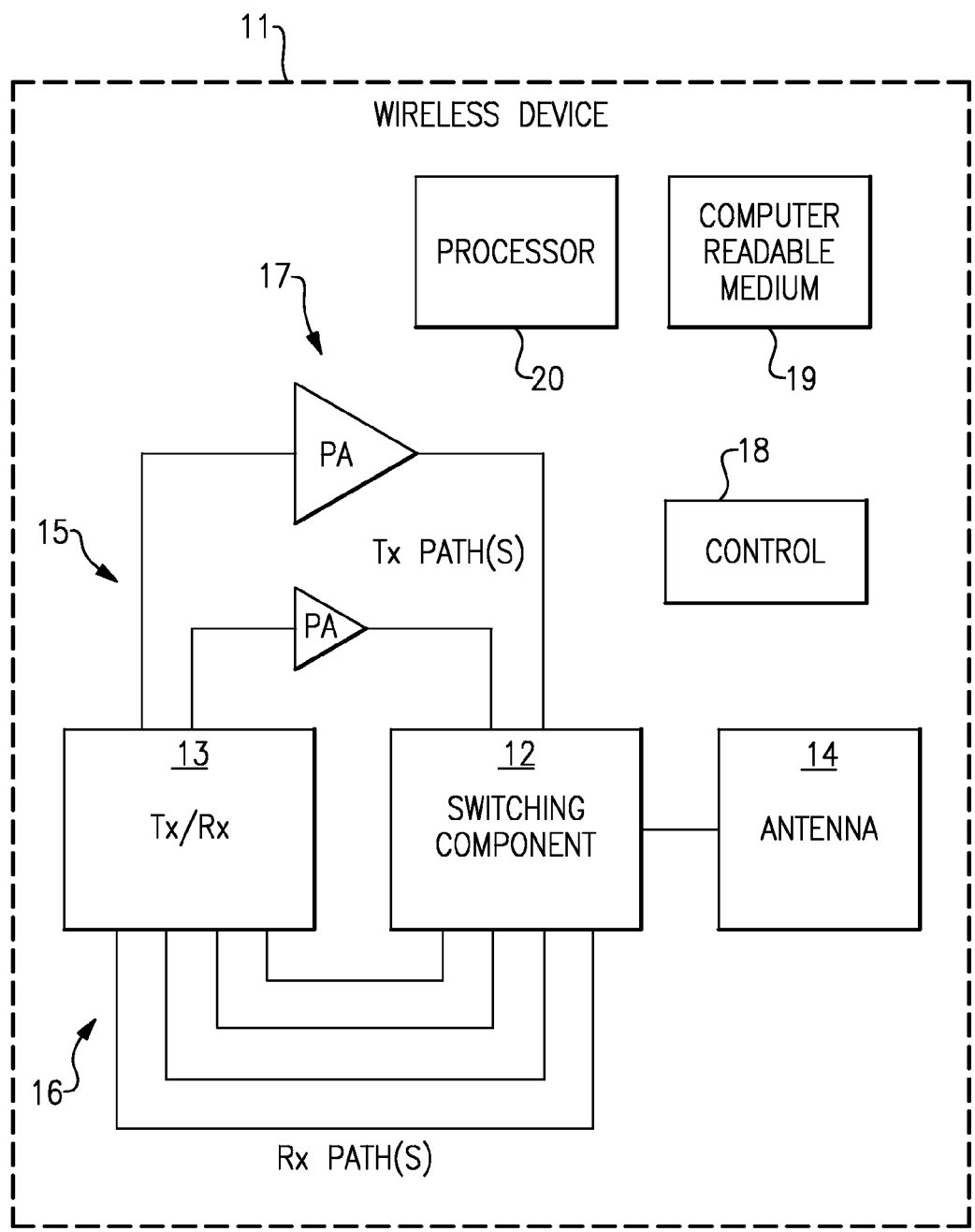
FIG. 2 schematically depicts an example wireless device that can have one or more of the power amplifier modules of FIG. 1 configured to provide one or more functionalities as described herein.

FIG. 2 schematically depicts a device 11, such as a wireless device, for which one or more power amplifiers controlled by one or more features of the present disclosure can be implemented. The example wireless device 11 depicted in FIG. 2 can represent a multi-band and/or multi-mode device such as a multi-band/multi-mode mobile phone.

By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), 1900 MHz (approximately 1850-1910 MHz for Tx, 1930-

1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 900 MHz and 1900 MHz bands.

One or more features of the present disclosure can be implemented in the foregoing example modes and/or bands, and in other communication standards. For example, 3G and 4G are non-limiting examples of such standards.

In certain embodiments, the wireless device 11 can include a transceiver component 13 configured to generate RF signals for transmission via an antenna 14, and receive incoming RF signals from the antenna 14. It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with one or more antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For example, two example power amplifiers 17 shown can represent amplifications associated with different power output configurations (e.g., low power output and high power output), and/or amplifications associated with different bands.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with.

FIG. 2 shows that in certain embodiments, a switching component 12 can be provided, and such a component can be configured to provide a number of switching functionalities associated with an operation of the wireless device 11. In certain embodiments, the switching component 12 can include a number of switches configured to provide functionalities associated with, for example, switching between different bands, switching between different power modes, switching between transmission and receiving modes, or some combination thereof. Various non-limiting examples of such switches are described herein in greater detail.

FIG. 2 shows that in certain embodiments, a control component 18 can be provided, and such a component can be configured to provide various control functionalities associated with operations of the switching component 12, the power amplifiers 17, and/or other operating component(s). Non-limiting examples of the control component 18 are described herein in greater detail.

FIG. 2 shows that in certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory (19 in FIG. 2) that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

Figure 3A:
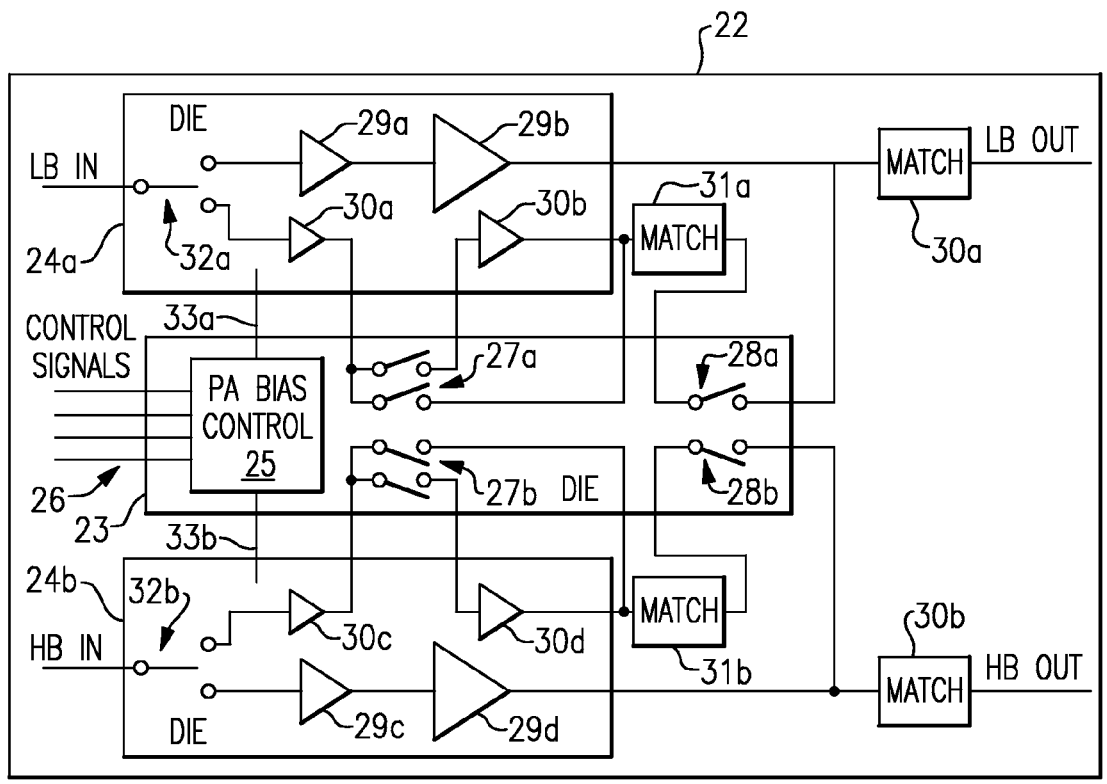
FIGS. 3A and 3B show example system architectures that can be implemented in the wireless device of FIG. 2.
Figure 3B:
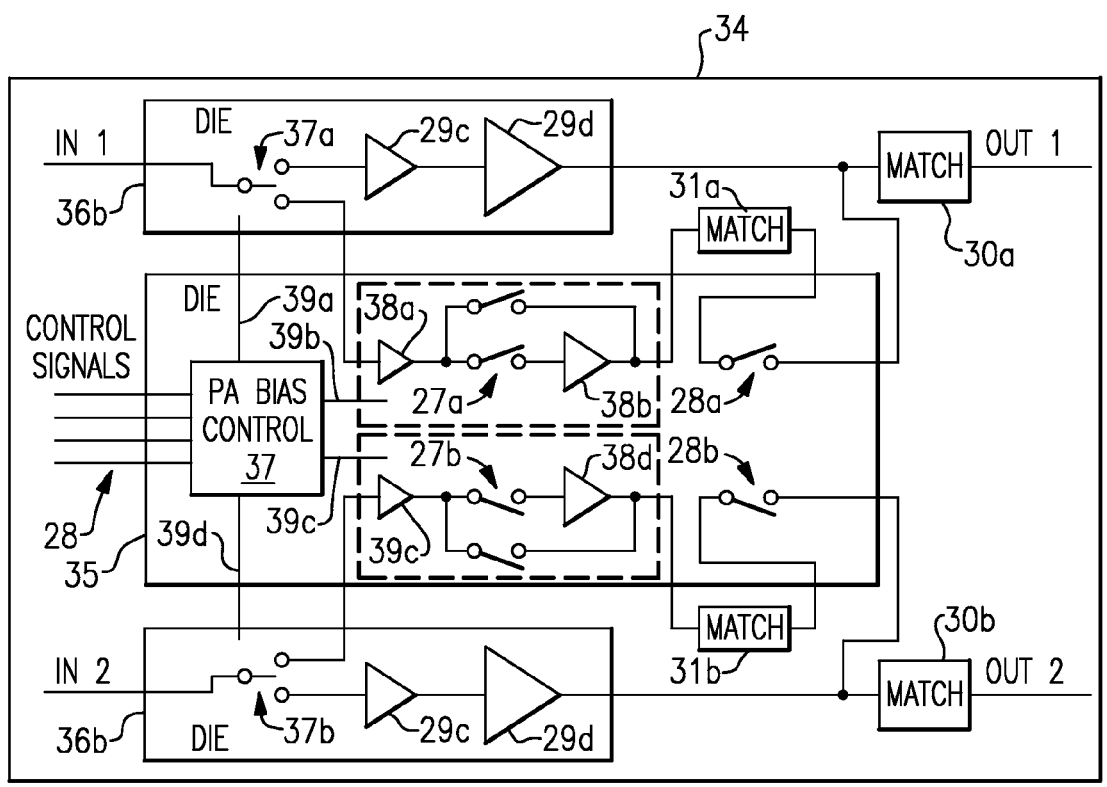

FIGS. 3A and 3B show non-limiting examples of system architectures that can include one or more features of the present disclosure. For the purpose of description, the example architectures are depicted with two RF bands; however, it will be understood that other numbers of RF bands are also possible. For example, system architectures having similar functionalities can be implemented in configurations having more than two bands (e.g., quad-band) or a single-band configuration.

In one example architecture 22, a first RF input indicated as "LB IN" and corresponding to a first band (e.g., a low band) can be amplified by one or more power amplifiers disposed and/or formed on a die 24a. Such amplified output RF signal is indicated as "LB OUT," and can be subjected to impedance matching (e.g., to approximately 50Ω) by a component depicted as 30a. Similarly, a second RF input indicated as "HB IN" and corresponding to a second band (e.g., a high band) can be amplified by one or more power amplifiers disposed and/or formed on a die 24b. Such amplified output RF signal is indicated as "HB OUT," and can be subjected to impedance matching by a component depicted as 30b (e.g., to approximately 50Ω).

In certain embodiments, amplification for a given RF band can include two or more amplification modes. For the example low RF band, the RF input LB IN can be routed to a high power amplification mode or a low/medium power amplification mode via a switch depicted as 32a. If the switch 32a is set for the high power mode, the RF signal can undergo amplification by one or more power amplifiers (e.g., by staged amplifiers 29a and 29b) so as to yield a high power output. If the switch 32a is set for the low/medium power mode, the RF signal can undergo amplification by one or more power amplifiers.

In certain embodiments, the switch 32a need not be employed. For example, the input impedance of the staged amplifiers 29a and 30a can be substantially matched, and the RF input LB IN can be provided to both staged amplifiers 29a and 30a.

In the example shown, a low power mode can be achieved by utilizing a power amplifier 30a; and a medium power mode can be achieved by amplifying the RF signal in stages by the power amplifier 30a and a second power amplifier 30b. Examples of switching and routing of the RF signals to allow selection of the low, medium and high power operating modes are described herein in greater detail. The low/medium amplified output RF signal can be subjected to impedance matching by a component depicted as 31a prior to being output in a manner similar to that of the high power output signal.

Similarly, for the example high RF band, the RF input HB IN can be routed to a high power amplification mode or a low/medium power amplification mode via a switch depicted as 32b. If the switch 32b is set for the high power mode, the RF signal can undergo amplification by one or more power amplifiers (e.g., by staged amplifiers 29c and 29d) so as to yield a high power output.

If the switch 32b is set for the low/medium power mode, the RF signal can undergo amplification by one or more power amplifiers. In the example shown, a low power mode can be achieved by utilizing a power amplifier 30c; and a medium power mode can be achieved by amplifying the RF signal in stages by the power amplifier 30c and a second power amplifier 30d. Examples of switching and routing of the RF signals to allow selection of the low, medium and high power operating modes are described herein in greater detail. The low/medium amplified output RF signal can be subjected to impedance matching by a component depicted as 31b prior to being output in a manner similar to that of the high power output signal.

In the example architecture 22 depicted in FIG. 3A, operation of the low and medium power modes can be facilitated by switch assemblies 27a, 28a (for the low band) and 27b, 28b (for the high band). To operate in a low or medium power mode, for the low band, the switch 28a can be closed, and the switch 32a can be in a state that routes the LB IN signal to the power amplifier 30a. To operate in a medium power mode, a connecting switch (depicted as the upper one in the switch assembly 27a) can be closed and a bypass switch (depicted as the lower one) can be opened, such that the power amplifiers 30a and 30b amplify the LB IN signal in stages to yield the medium power output. To operate in a low output mode, the connecting switch of the switch assembly 27a can be opened and the bypass switch of the switch assembly 27a can be closed, such that the LB IN signal is amplified by the power amplifier 30a by bypasses the power amplifier 30b so as to yield the low power output. Operation of low or medium power mode for the high band can be achieved in a similar manner utilizing the switch assemblies 27b and 28b.

In the example configuration 22 shown in FIG. 3A, various switches (e.g., 27a, 27b, 28a, 28b) are depicted as being part of a die 23. In certain embodiments, the die 23 can also include a power amplifier bias control component 25. The PA bias control component 25 is depicted as controlling the example PAs (29a, 29b, 30a, 30b of the low band portion, and 29c, 29d, 30c, 30d of the high band portion) via bias control lines depicted as 33a and 33b. In certain embodiments, the PA bias control component 25 can be provided with one or more input control signals 26 so as to facilitate one or more functionalities associated with various PAs as described herein.

In certain embodiments, various switches and power amplifiers associated with the dies depicted as 24a, 24b can be fabricated on substrates such as gallium arsenide (GaAs) utilizing devices such as pseudomorphic high electron mobility transistors (pHEMT) or bipolar field effect transistors (BiFET). In certain embodiments, the dies depicted as 24a, 24b in FIG. 3A can be formed on the same GaAs substrate, or on separate GaAs substrates. Further, functionalities associated with the dies depicted as 24a, 24b can be formed on a single die, or on separate dies.

In certain embodiments, various switches (e.g., 27a, 27b, 28a, 28b) associated with operation of various PAs (e.g., 29a, 29b, 30a, 30b of the low band portion, and 29c, 29d, 30c, 30d of the high band portion) can be fabricated as complementary metal-oxide-semiconductor (CMOS) devices. In certain embodiments, at least some of the PA bias control component 25 can be implemented on a CMOS die. In the example shown in FIG. 3A, the switches (e.g., 27a, 27b, 28a, 28b) and the PA bias control component 25 are depicted as being parts of the same CMOS die 26. In certain embodiments, such switches and PA bias control component can be parts of different CMOS dies.

In certain embodiments, at least one power amplifier and one or more switches associated with its operation can be implemented on a CMOS die. FIG. 3B shows an example architecture 34 that can generally provide dual-band signal amplification functionalities similar to that described in reference to FIG. 3A. In FIG. 3B, "IN 1" and "OUT 1" can represent the low band input and output LB IN and LB out; and "IN 2" and "OUT 2" can represent the high band input and output HB IN and HB OUT. Further, switching functionality associated with switches 32a and 32b can be provided by switches 37a and 37b. For high power mode of operation, PAs 29a, 29b, 29c, 29d that are parts of dies 36a, 36b can be similar to the dies 24a, 24b described in reference to FIG. 3A.

In FIG. 3B, power amplifiers 38a, 38b, 38c, 38d corresponding to the medium/low power modes are depicted as being formed on the same die 35 (e.g., CMOS die) on which the switches (e.g., 27a, 27b, 28a, 28b) are formed. Other than these components being on the same CMOS die, operation of the example medium/low power modes can be achieved in a manner similar to those described in reference to FIG. 3A.

Similar to FIG. 3A, the example configuration 34 of FIG. 3B includes a PA bias control component 37 that is part of the example CMOS die 35. The PA bias control component 37 is depicted as receiving one or more input control signals 28 and controlling one or more functionalities associated with the various PAs. The PAs (e.g., 29a, 29b for the first band, and 29c, 29d for the second band) associated with the high power mode are depicted as being controlled via bias control lines 39a and 39b. The PAs (e.g., 38a, 38b for the first band, and 38c, 38d for the second band) associated with the medium/low mode are depicted as being controlled via bias control lines 39c and 39d.

It will be understood that the configurations 22 and 34 of FIGS. 3A and 3B are specific examples of design architectures that can be implemented. There are a number of other configurations that can be implemented utilizing one or more features of the present disclosure.

Figure 4A:
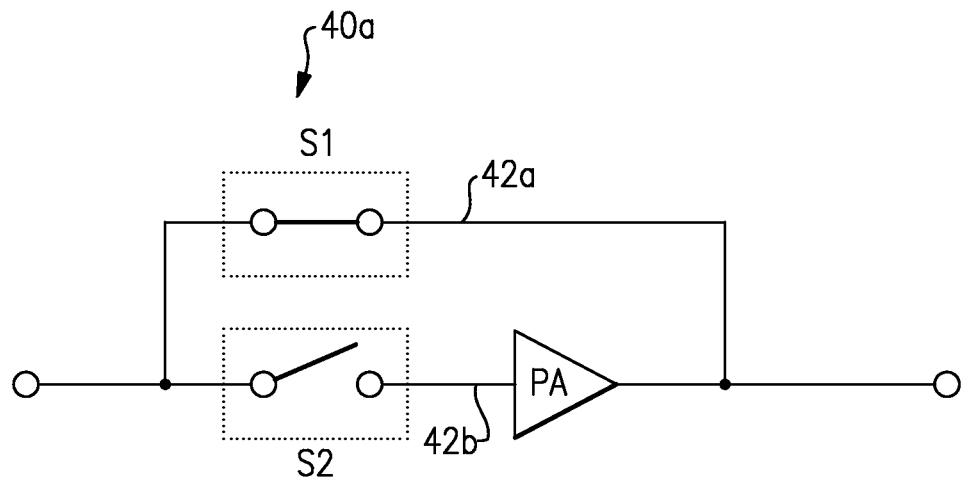
FIGS. 4A and 4B schematically depict an example of how an RF signal to a power amplifier can be switched ON or OFF.
Figure 4B:
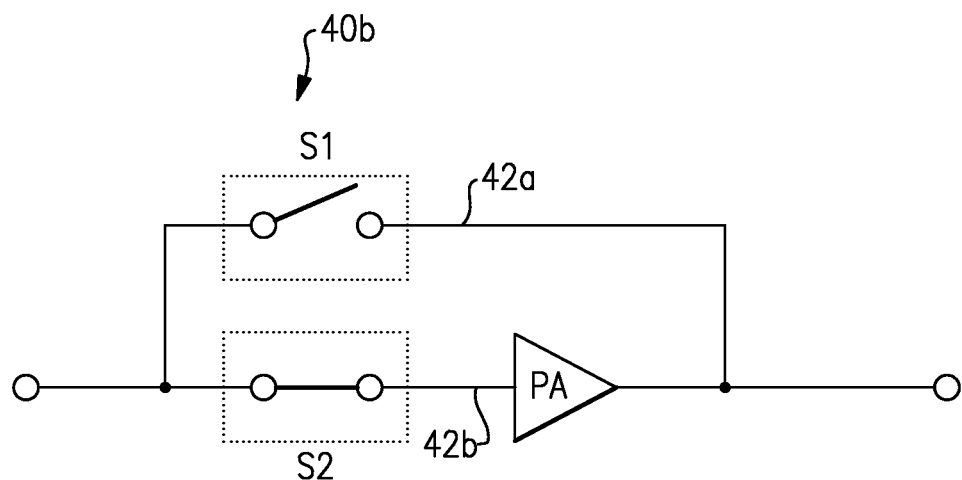

In the context of switches for RF power amplifiers, FIGS. 4A and 4B shows a switching configuration 40 that can form a basis for more complex architectures. In a signal path configuration 40a of FIG. 4A, an RF signal can be routed through a first path 42a by providing a switch S1 that is closed. In the configuration 40a, second path 42b is depicted as having a switch S2 that is open and a power amplifier. Thus, for the purpose of operating the power amplifier in the example path 42b, the configuration 40a can represent an OFF state.

In a signal path configuration 40b of FIG. 4B that can represent an ON state for the power amplifier, the switch S2 on the second path 42b is closed and the switch S1 on the first path 42a is open. For the purpose of description of FIGS. 4A and 4B, the first example path 42a is depicted without any component other than the switch S1. It will be understood that there may be one or more components (e.g., one or more power amplifiers) along the first path 42a.

In the context of power amplifiers that can be included in portable and/or wireless devices (e.g., mobile phones), a power amplifier module can be subjected to varying processes and operating conditions such as voltage and temperature variations. For example, a power amplifier module can be powered using a variable supply voltage, such as a battery of a mobile phone.

In certain situations, it can be important for a power amplifier module to switch between power modes so that the power amplifier switch can control power consumption. For example, in a mobile device embodiment, having a plurality of power modes allows the power amplifier to extend battery life. Control signals, such as mode input signals received on a pin or pad, can be used to indicate a desired mode of operation. The power amplifier module can include a plurality of RF signal pathways, which can pass through power amplification stages of varying gain. Switches can be inserted in and/or about these pathways, and switch control logic can be used to enable the switches and power amplifiers associated with the selected power amplifier RF signal pathway.

Placing a switch in a signal path of a power amplifier (e.g., in the example signal path 42b of FIGS. 4A and 4B) can produce a number of effects. For example, insertion of a switch into a RF signal pathway can result in a loss of signal power due to radiation and resistive losses. Additionally, even a switch in an OFF state placed along an active RF signal pathway can attenuate a RF signal. Thus, it can be important that the switch introduce low insertion loss in both ON and OFF states. Furthermore, it can be important that the switch be highly or acceptably linear, so as to reduce distortion of a RF signal which passes through the switch. Distortion can reduce the fidelity of an RF signal; and reduction of such distortion can be important in a mobile system embodiment.

In certain embodiments, switches can be integrated on a mixed-transistor integrated circuit (IC) having power amplification circuitry, such as a BiFET, BiCMOS die employing silicon or GaAs technologies. Additionally, switches can be provided on a discrete die, such as a pHEMT RF switch die, and can be configured to interface with a mixed-transistor power amplifier die to implement a configurable power amplifier module. However, these approaches can be relatively expensive and consume significant amounts of area as compared to a silicon CMOS technology. Power consumption and the area of a power amplifier module can be important considerations, such as in mobile system applications. Thus, there is a need for employing a CMOS switch in a RF signal power amplifier module.

In certain embodiments, CMOS RF switches can be relatively large, so that the switch resistance in an ON-state can be relatively small so as to minimize RF insertion loss. However, large CMOS RF switches can have undesirable parasitic components, which can cause significant leakages and cause damage to RF signal fidelity. Additionally, the wells and active areas of the CMOS RF switches can have associated parasitic diode and bipolar structures. Without proper control of the wells of a CMOS RF switch, parasitic structures may become active and increase the power consumption of the power amplifier module and potentially render the system dysfunctional. Furthermore, CMOS devices are susceptible to breakdown, such as gate oxide breakdown, and other reliability concerns, so it can be important to properly bias a CMOS RF switch during operation.

In certain embodiments, one or more switches described herein can be selectively activated depending on a variety of factors, including, for example, a power mode of the power amplifier module. For example, in a high power mode a CMOS RF switch may be positioned in an OFF state and configured to be in a shunt configuration with the active RF signal path. The isolated P-well voltage of such a switch can be controlled to both prevent overvoltage or other stress conditions which may endanger the reliability, while optimizing or improving the linearity of the switch. The linearity of the RF signal pathway having a shunt CMOS switch in an OFF-state can be improved by keeping the isolated P-well voltage at a selected voltage (e.g., relatively low voltage) so as to avoid forward biasing of parasitic diode structures formed between the P-well and the N-type diffusion regions of the source and drain. By preventing the forward-biasing of parasitic diode structures, the injection of unintended current into the active RF signal pathway can be avoided, thereby increasing linearity of the power amplifier module.

Figure 5:
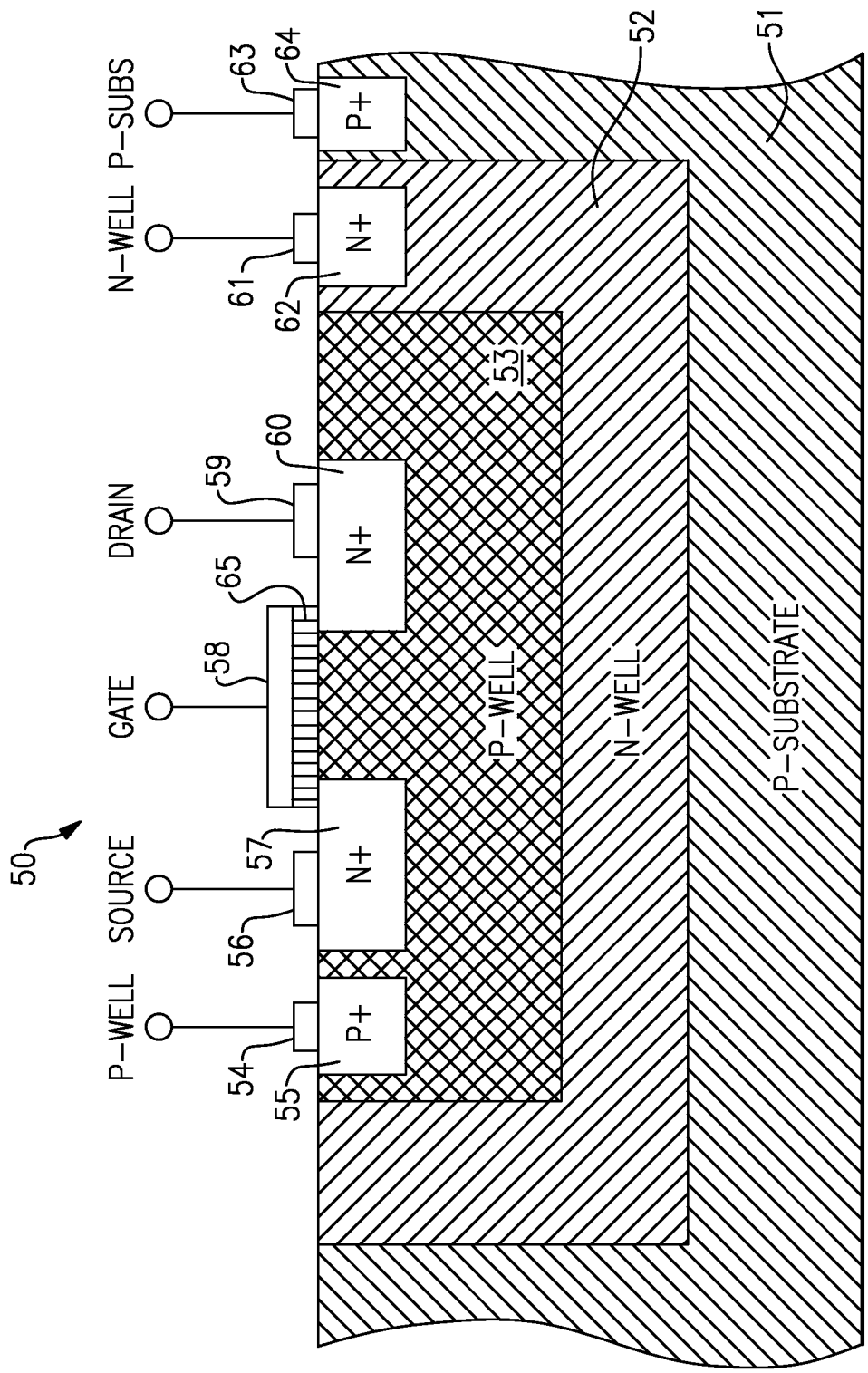
FIG. 5 shows that in certain embodiments, the switch depicted in FIGS. 4A and 4B can be formed as a triple-well CMOS device.

In certain embodiments, some or all of the foregoing example properties can be addressed by one or more features associated with a CMOS RF switch, such as a switch 50 depicted in FIG. 5. The example switch 50 can include a triple-well structure having an N-well 52 and a P-well 53 formed on a P-type substrate 51. As shown in FIG. 5, the N-well 52 can surround the P-well 53 so as to electrically isolate the P-well 53 from the substrate 51. The N-well 52 can be formed by using, for example, a deep N-well or any other suitable N-type buried layer.

The switch 50 further includes a source terminal 56 and a drain terminal 59. An oxide layer 65 is disposed on the P-well 53, and a gate 58 is disposed on top of the oxide layer 65. An N-type source diffusion region and an N-type drain diffusion region corresponding to the source and drain terminals (56, 59) are depicted as regions 57 and 60, respectively. In certain embodiments, formation of the triple-well structure and the source, drain and gate terminals thereon can be achieved in a number of known ways.

In certain operating situations, an input signal can be provided to the source terminal 56. Whether the switch 50 allows the input signal to pass to the drain terminal 59 (so as to yield an output signal) can be controlled by application of bias voltages to the gate 58. For example, application of a first gate voltage can result in the switch 50 being in an "ON" state to allow passage of the input signal from the source terminal 56 to the drain terminal 59; while application of a second gate voltage can turn the switch 50 "OFF" to substantially prevent passage of the input signal.

In certain embodiments, the switch 50 can include a P-well terminal 54 connected to the P-well 53 by a P-type diffusion region 55. In certain embodiments, the P-type diffusion region 55 and the N-type diffusion regions 57 and 60 can be all formed substantially in the P-well 53. In certain embodiments, the P-well terminal 54 can be provided with one or more voltages, or held at one or more electrical potentials, to facilitate controlling of an isolated voltage of the P-well. Examples of such P-well voltages are described herein in greater detail.

In certain embodiments, the switch 50 can include an N-well terminal 61 connected to the N-well 52 by an N-type diffusion region 62. In certain embodiments, the N-type diffusion region 62 can be formed substantially in the N-well 52. In certain embodiments, the N-well terminal 61 can be provided with one or more voltages, or held at one or more electrical potentials, to provide the switch 50 with one or more desired operating performance features. One or more examples of such N-well voltages are described herein in greater detail.

In certain embodiments, the switch 50 can include a P-type substrate terminal 63 connected to the P-type substrate 51 and having a P-type diffusion region 64. In certain embodiments, the P-type diffusion region 64 can be formed substantially in the P-type substrate 51. In certain embodiments, the P-type substrate terminal 63 can be provided with one or more voltages, or held at one or more electrical potentials, to provide the switch 50 with one or more desired operating performance features. One or more examples of such N-well voltages are described herein in greater detail.

Figure 6:
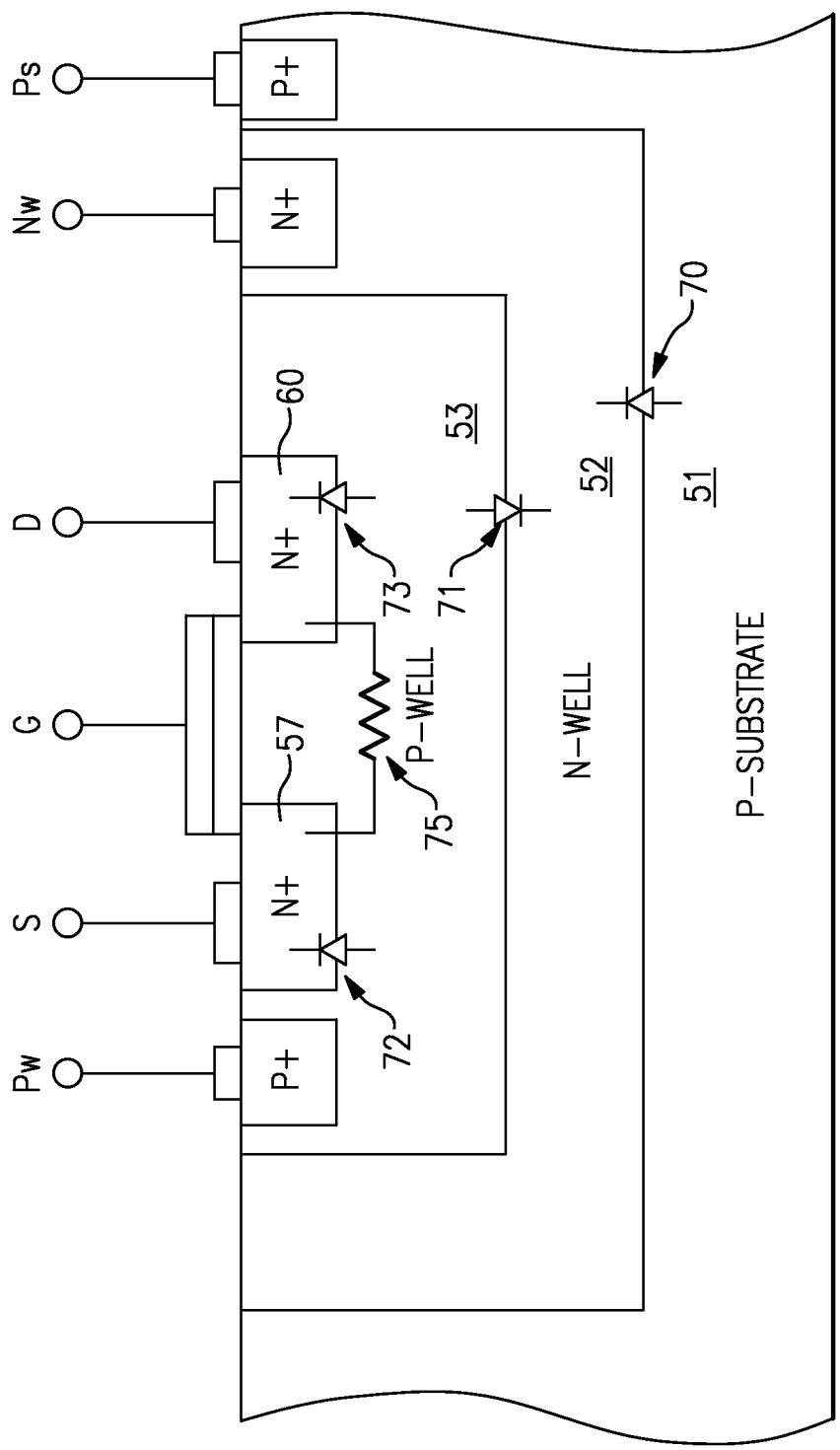
FIG. 6 shows an example configuration for operating the triple-well CMOS switch of FIG. 5.

In the example CMOS device shown in FIG. 5, the switching functionality of the switch 50 is generally provided by an NMOS transistor defined by the N-type diffusion regions (57, 60) in the P-well 53. FIG. 6 shows that for such a configuration, diodes can form at p-n junctions of the triple well structure. For example, a diode 72 can have an anode formed from the P-well 53, and a cathode formed from the N-type diffusion region 57. Similarly, a diode 73 can have an anode formed from the P-well 53 and a cathode formed from the N-type diffusion region 60. Depending on the voltage of the P-well 53 relative to the voltages of the N-type diffusion regions 57 and 60, the diodes 72 and 73 can be biased in, for example, a reverse bias or forward bias region of operation. For the purpose of description herein, bias voltages applied to the N-type diffusion regions 57 and 60 (corresponding to the source and drain terminals, respectively) may or may not be the same. Further, for the purpose of description herein, a reverse bias can include a configuration where a voltage associated with an N-type region is equal to or greater than a voltage associated with a P-type region that forms a p-n junction with the N-type region.

In certain embodiments, the N-type diffusion regions 57 and 60 can be held at substantially the same DC voltage. In certain embodiment, such a configuration can be achieved by providing a relatively large value shunt resistor (e.g., polysilicon resistor) 75 across the source and the drain.

In the context of triple-well CMOS devices, the N-well 52 can substantially isolate the P-well 53 from the P-type substrate 51. In certain embodiments, the presence of the N-well 52 between the P-well 53 and the P-type substrate 51 can result in two additional diodes. As shown in FIG. 6, the illustrated triple well structure can include a diode 71 having an anode formed from the P-well 53 and a cathode formed from the N-well 52. Similarly, the triple well structure can include a diode 70 having an anode formed from the P-type substrate 51 and a cathode formed from the N-well 52.

In certain embodiments, the switch 50 can be operated so as to reverse-bias one or more of the diodes shown in FIG. 6. To maintain such reverse-biases, the source terminal, drain terminal, gate terminal, P-well terminal, N-well terminal, P-substrate terminal, or any combination thereof, can be provided with one or more voltages, or held at one or more electrical potentials. In certain embodiments, such voltages or electrical potentials can also provide one or more additional functionalities that can improve the performance of the switch 50. Non-limiting examples of such performance enhancing features are described herein in greater detail.

Although FIGS. 5 and 6 have described an NMOS transistor as providing the functionality of a switch, a PMOS transistor can also be employed.

Overview of Directional Coupler Systems

Figure 7:
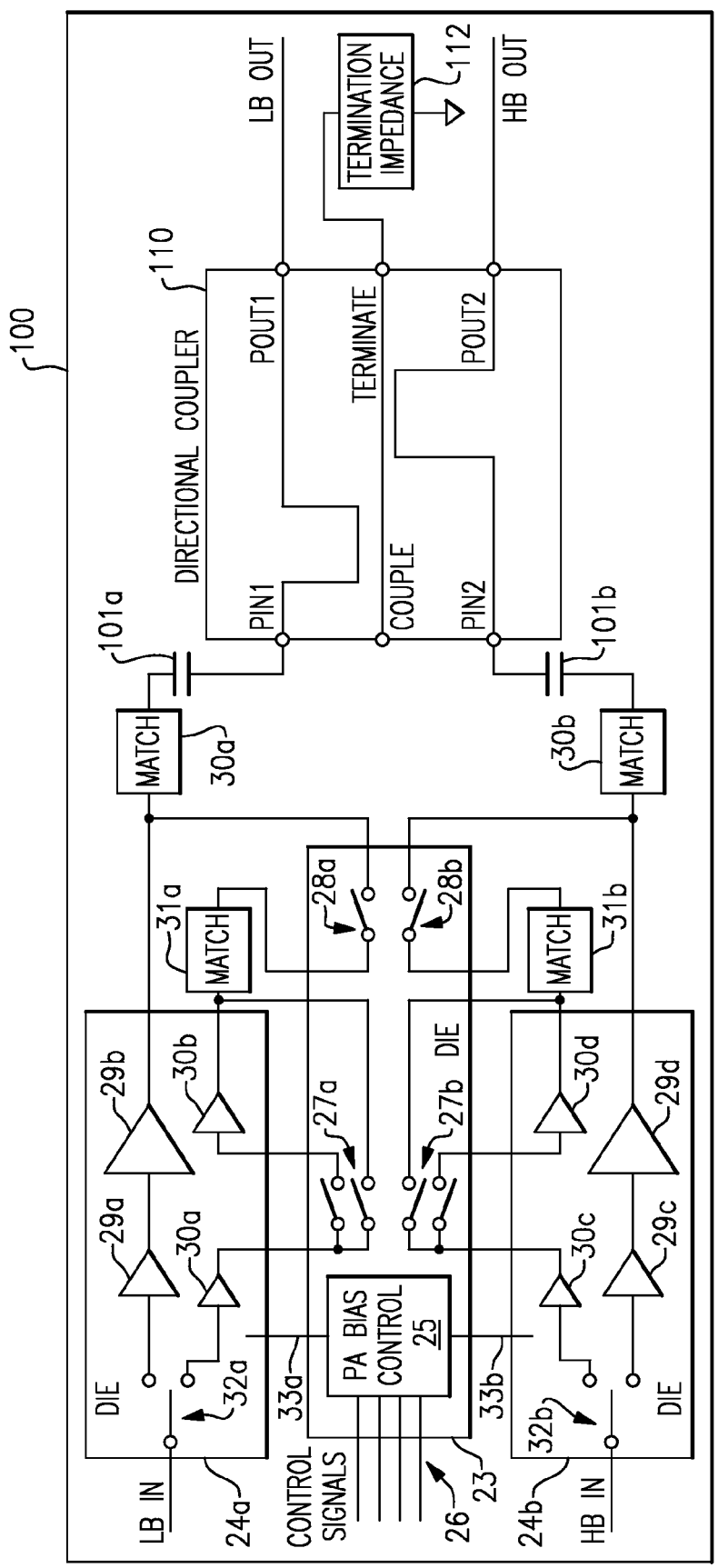
FIG. 7 is a schematic diagram of a power amplifier module in accordance with one embodiment.

FIG. 7 is a schematic diagram of a power amplifier module 100 in accordance with one embodiment. The power amplifier module 100 includes dies 23, 24a, 24b, impedance matching circuits 30a, 30b, 31a, 31b, capacitors 101a, 101b, directional coupler 110, and termination impedance 112. Although FIG. 7 is illustrated for the case of two RF bands, the power amplifier module 100 can be configured to amplify more or fewer RF bands.

The die 24a includes power amplifiers 29a, 29b, 30a, 30b and switch 32a. The die 24a is configured to receive the first RF input labeled "LB IN" and corresponding to a relatively low operational frequency band. The first RF input can be amplified by one or more power amplifiers disposed on die 24a. Impedance matching blocks 30a, 31a can be used to aid in terminating a RF output signal generated by the power amplifiers of the die 24a. Additional details of the die 24a can be as described above with reference to FIG. 3A.

The die 24b includes power amplifiers 29c, 29d, 30c, 30d and switch 32b. The die 24b is configured to receive the second RF input labeled "HB IN" and corresponding to a relatively high operational frequency band. The second RF input can be amplified by one or more power amplifiers disposed on die 24b, and impedance matching blocks 30b, 31b can be used to terminate a RF output signal generated by the power amplifiers 29c, 29d, 30c, 30d. Additional details of the die 24b can be as described above with reference to FIG. 3A.

The die 23 can include a power amplifier bias control block 25 and switches 27a, 27b, 28a, and 28b. The power amplifier bias control block 25 can be configured to generate bias control voltages and/or currents to aid in biasing one or more power amplifiers of the power amplifier module 100. In certain embodiments, amplification for a given RF band can include two or more amplification modes. For example, the RF input LB IN can be routed through a high power amplification pathway or a low/medium power amplification pathway using the switches 32a, 28a, and the RF input HB IN can be routed to a high power amplification pathway or a low/medium power amplification pathway using the switches 32b, 28b. The switches 27a, 27b can be controlled to achieve a particular level of amplification in the low/medium power amplification pathways. For example, the switches 27a can be used to selectively include or exclude the power amplifier 30b from the low/medium power amplification pathway for the RF input LB IN, and the switches 27b can be used to selectively include or exclude the power amplifier 30d from the low/medium power amplification pathway for the RF input HB IN.

In certain embodiments, various switches and power amplifiers associated with the dies depicted as 24a, 24b can be fabricated on GaAs substrates using, for example, pHEMT or BiFET transistors, and the switches, power amplifiers, and bias control blocks associated with the die 23 can be fabricated on a Silicon substrate using CMOS transistors.

The directional coupler 110 can be included in the power amplifier module 100. The directional coupler 110 can include a PIN1 terminal, a PIN2 terminal, a POUT1 terminal, a POUT2 terminal, a COUPLE terminal, and a TERMINATE terminal. The directional coupler 110 can be configured to receive amplified versions of the RF signals LB IN and HB IN using capacitors 101a, 101b. For example, the first capacitor 101a can have a first end electrically connected to the output of the impedance matching block 30a and a second end electrically connected to the PIN1 terminal, and the second capacitor 101b can have a first end electrically connected to the output of the impedance matching block 30b and a second end electrically connected to the PIN2 terminal. The amplified versions of the RF signals LB IN and HB IN can travel through the directional coupler 110 and can be provided as outputs LB OUT and HB OUT of the power amplifier module 100, respectively.

The COUPLE terminal can be used to measure RF signals traveling along the PIN1 to POUT1 and PIN2 to POUT2 pathways. The TERMINATE terminal can be electrically connected to a termination impedance 112 to aid in preventing reflections when measuring RF signals along the PIN1 to POUT1 and PIN2 to POUT2 pathways. The LB OUT and HB OUT outputs can be electrically connected to a load, such as an antenna. The directional coupler 100 can measure travelling RF signals associated with the LB OUT and HB OUT outputs.

The directional coupler 110 can have a directivity related to the ability of the directional coupler 110 to differentiate between forward and reverse travelling RF signals. For example, directivity can equal the ratio of forward to reverse signal power coupled to the COUPLE terminal by a forward travelling RF signal and a reverse travelling RF signal of about equal power. The directional coupler 110 can have a low band (LB) directivity associated with the ratio of signal power between a forward RF signal travelling from the PIN1 terminal to the POUT1 terminal and a reverse RF signal of about equal power travelling from the POUT1 terminal to the PIN1 terminal. Likewise, the directional coupler 110 can have a high band (HB) directivity associated with the ratio of signal power between a forward RF signal travelling from the PIN2 terminal to the POUT2 terminal and a reverse RF signal of about equal power travelling from the POUT2 terminal to the PIN2 terminal.

Directivity can be important for accurately measuring the output power of a power amplifier. For example, it can be important for the power measured using the COUPLE terminal of a directional coupler to track the output power of the power amplifier as the output load impedance of the amplifier varies. Improving the directivity of a directional coupler can improve the accuracy of power measurements made using the COUPLE terminal. Accurately measuring the output power of a power amplifier can aid in, for example, monitoring the transmitted and reflected power resulting from impedance mismatch of an antenna or other load.

In certain embodiments, power measurements made using the directional coupler 110 can be used to make adjustments to the power amplifier module 100. For example, an output signal power can be measured using the COUPLE terminal of the direction coupler 110 and a power detector, and the measured power can be used to vary the control signals 26 provided to the power amplifier bias control block 25. Thus, the directional coupler 110 can aid in controlling and biasing the power amplifier module 100.

The design of the directional coupler 110 can be complicated by a variety of factors. For example, the directional coupler 110 can be employed in a power amplifier module which does not use 50 ohm termination impedances. Additionally, the line impedance of the directional coupler 110 can be constrained by a process used in making the directional coupler. For example, the process can have line width limitations or constraints on the spacing between dielectric layers. Furthermore, termination impedance can vary across power modes, such as between a low, a medium and a high power mode, as well as between frequency bands.

The termination impedance 112 can have a value selected to optimize directivity for a particular frequency band or power mode. However, the termination impedance which is an optimum for one particular frequency band or power mode may not be optimum for another frequency band or power mode. A reactive load can be added to a termination impedance to aid in steering the termination impedance to a value having improved directivity for a particular frequency band. However, adding a reactive load to a termination impedance can degrade return loss.

There is a need for modifying termination impedance of a directional coupler. Furthermore, there is a need for selectively varying termination impedance so as to increase coupler directivity for a particular frequency band and/or power mode.

In one embodiment, one or more switches are used to vary the termination impedance across a setting or mode of a power amplifier module. The switches can be configured to set the termination impedance 112 to a value which is desirable for a particular mode of operation. This can avoid setting the termination impedance to a fixed value which can yield relatively good results for one frequency band or power mode, but which can degrade results for a another frequency band or power mode.

Figure 8:
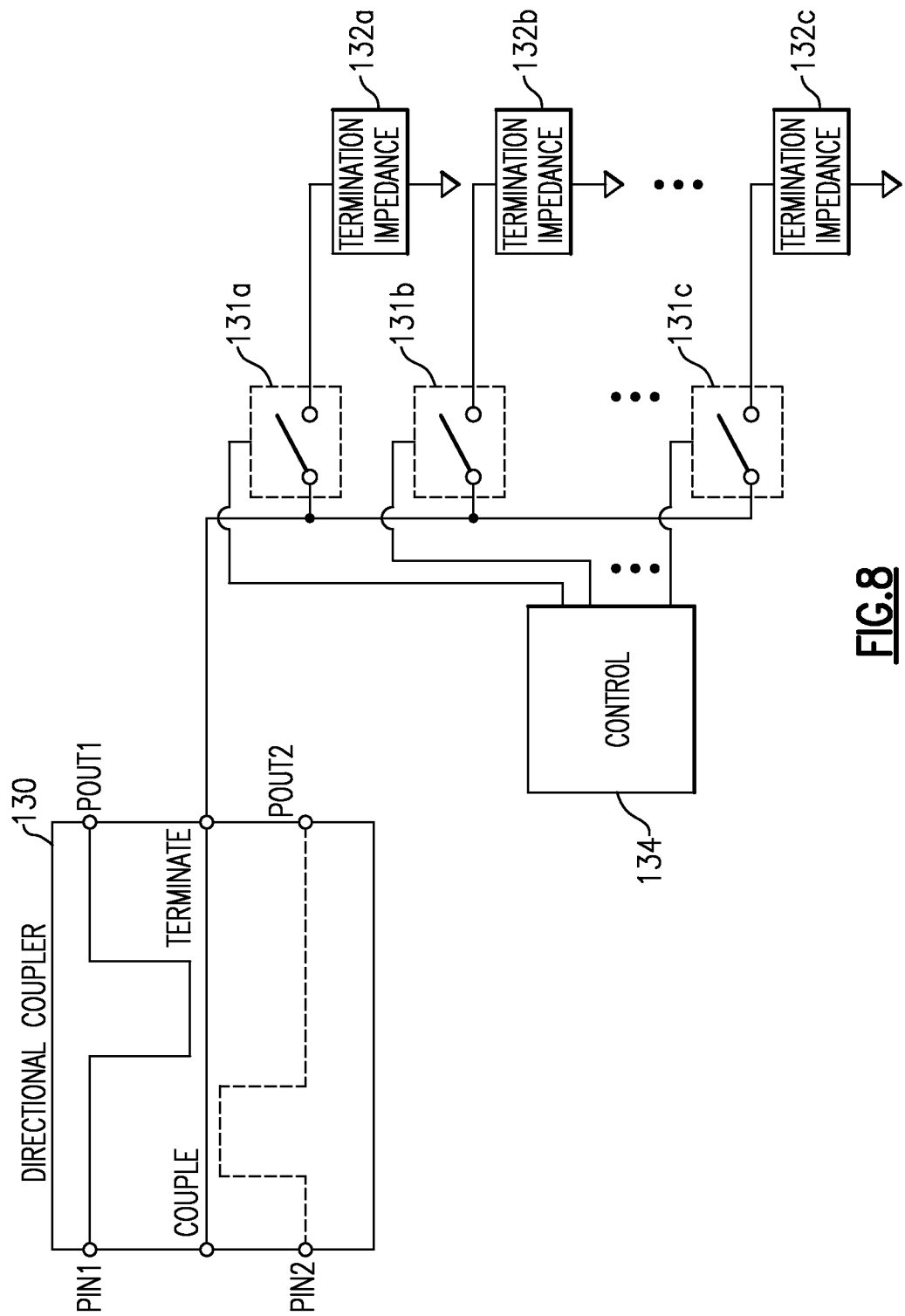
FIG. 8 is a schematic diagram of a directional coupler having configurable termination impedance in accordance with one embodiment.

FIG. 8 is a schematic diagram of a directional coupler having configurable termination impedance in accordance with one embodiment. The directional coupler 130 includes a PIN1 terminal, a POUT1 terminal, a COUPLE terminal, and a TERMINATE terminal. The directional coupler 130 can be a dual-band directional coupler, and can include a PIN2 terminal and a POUT2 terminal. Furthermore, the directional coupler 130 can be electrically coupled to additional bands using additional PIN and POUT terminals. Additional details of the directional coupler 130 can be similar to those described above.

The TERMINATE terminal of the directional coupler 130 can be electrically connected to the inputs of one or more switches. For example, the TERMINATE terminal can be electrically connected to the inputs of a first switch 131a, a second switch 131b, and a third switch 131c. The outputs of the switches 131a, 131b, and 131c can be electrically connected to termination impedances 132a, 132b, and 132c, respectively.

The switches 131a-131c and termination impedances 132a-132c can be used to improve the directivity of the directional coupler 130. For example, a first impedance 132a can be selected for a high power mode, a second impedance 132b can be selected for a medium power mode, and a third impedance 132c can be selected for a low power mode. Likewise, a particular impedance can be selected for a particular frequency band of operation. Having a particular impedance for a particular power mode and/or frequency band can improve the directivity of the directional coupler 130, which can aid in improving, for example, the accuracy of reflected power measurements made using the COUPLE terminal.

The switches 131a-131c can be controlled using the control block 134. The control block 134 can include circuitry for selectively opening one or more of the switches 131a-131c to achieve the desired termination impedance for the directional coupler 130. For example, the control block 134 can include digital logic for operating the switches. The digital logic can operate on any suitable power supply, including, for example, an output voltage of a charge pump. In one embodiment, the control block 134 is configured to operate using a processor receiving instructions stored on a computer readable storage media.

The termination impedances can be, for example, resistive, capacitive, and/or inductive loads selected to achieve the desired impedance for a particular power mode and/or frequency band. For example, the first impedance 132a can be a resistor having a resistance of about 24Ω in parallel with a capacitor of about 1 pF, and can correspond to an impedance value which provides improved performance for a particular power mode and/or frequency band. Likewise, the impedances 132b-132c can have impedance values selected to achieve improved performance for a particular frequency band and/or power mode. One or more impedances, such as, for example, the impedance 132c, can be a resistive termination having an impedance equal to about 50Ω.

In one embodiment, a TERMINATE terminal of a second directional coupler can be electrically connected to the COUPLE terminal of the directional coupler 130 so as to share termination impedances with the direction coupler 130. Furthermore, a TERMINATE terminal of a third directional coupler can be electrically connected to the COUPLE terminal of the second directional coupler so as to also share termination impedances. In this manner, one or more directional coupler can be included in a daisy chain configuration to share impedances 132a-132c.

Although FIG. 8 illustrates a configuration in which three switches 131a-131c and three termination impedances 132a-132c are used, more or fewer switches and/or termination impedances can be employed.

Figure 9:
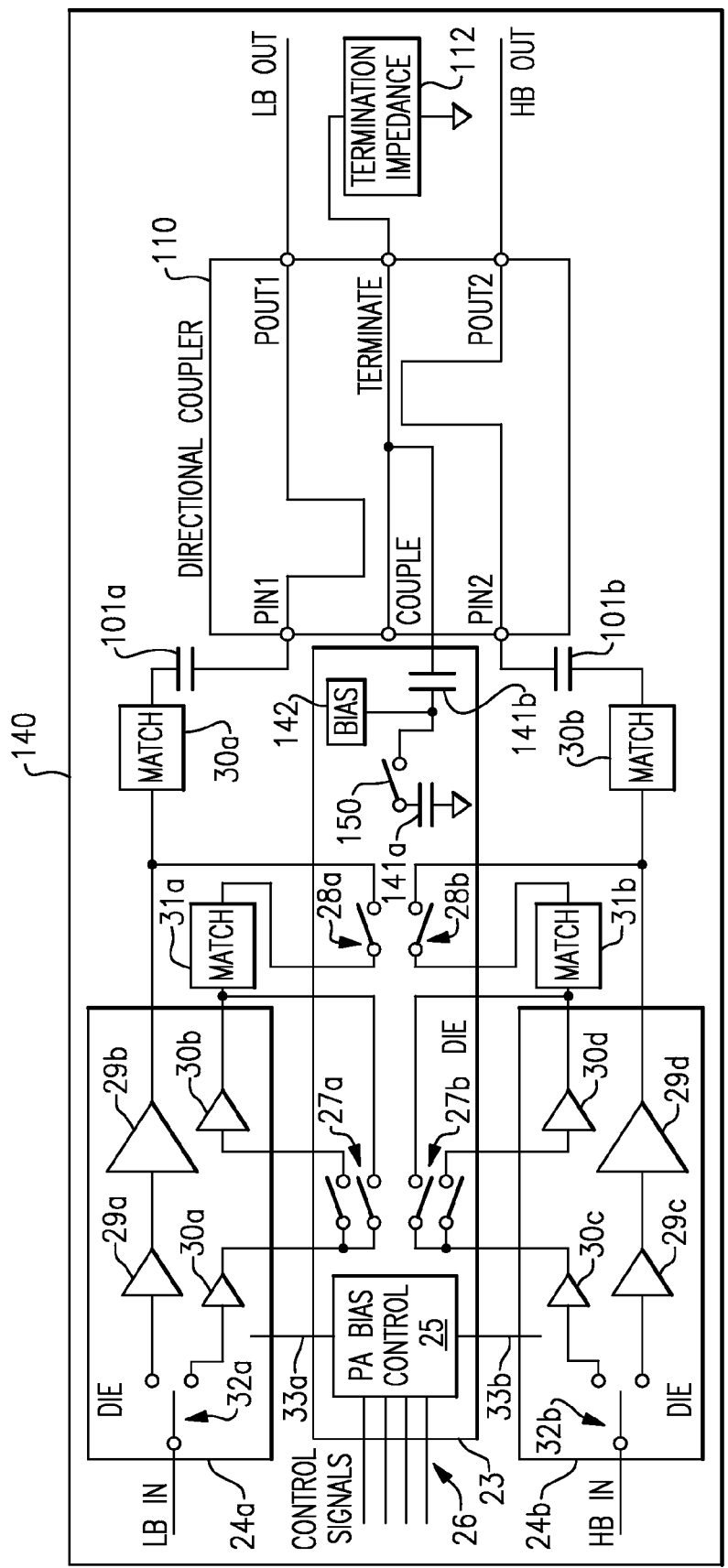
FIG. 9 is a schematic diagram of a power amplifier module in accordance with another embodiment.

FIG. 9 is a schematic diagram of a power amplifier module 140 in accordance with another embodiment. The power amplifier module 140 includes dies 23, 24a, 24b, impedance matching circuits 30a, 30b, 31a, 31b, capacitors 101a, 101b, directional coupler 110, and termination impedance 112. The die 24a includes power amplifiers 29a, 29b, 30a, 30b and switch 32a, and the die 24b includes power amplifiers 29c, 29d, 30c, 30d and switch 32b. Additional details of the dies 24a, 24b the impedance matching circuits 30a, 30b, 31a, 31b directional coupler 110, and termination impedance 112 can be as described earlier.

The die 23 can include a power amplifier bias control block 25 and switches 27a, 27b, 28a, and 28b as described above. Additionally, the die 23 can include capacitors 141a, 141b, switch 150 and bias block 142. The capacitor 141a can include a first end connected to a reference potential and a second end electrically connected to the output of the switch 150. The capacitor 141b can include a first end electrically connected to the input of the switch 150 and to the bias block 142, and a second end electrically connected to the directional coupler 100.

The switch 150 permits the capacitors 141a, 141b to be selectively included in series with the termination impedance 112. As shown in FIG. 9, the second end of the capacitor 141b need not be connected directly to the TERMINATE terminal of the directional coupler 110. Rather, the second end of the capacitor 141b can be electrically connected between the COUPLE and TERMINATE terminals of the directional coupler 110. In certain embodiments, this can be advantageous to reduce the length of the connection between the second end of the capacitor 141b and the connection to the directional coupler 110. For example, in an embodiment in which a bond wire is used to make this connection, the length of the bond wire may be reduced by permitting flexibility in the location in which the second end of the capacitor 141b electrically connects with the directional coupler 110. However, in other embodiments, the second end of the capacitor 141b can be electrically connected to the directional coupler 110 in other locations, including, for example, the TERMINATE terminal of the directional coupler 110.

Selectively including the capacitors 141a, 141b can aid in improving directivity of the directional coupler 110 across frequency bands. For example, the termination impedance can be equal to about the termination impedance 112 for a first frequency band, and the termination impedance can be equal to the series combination of the capacitors 141a, 141b in parallel with the termination impedance 112 for a second frequency band. By selecting the values of capacitors 141a, 141b and termination impedance 112, the performance across frequency bands can be improved relative to a design in which a single fixed termination impedance is employed.

The capacitors 141a, 141b can be disposed on the die 23. In one embodiment, the die 23 is a CMOS die, and the capacitance of the capacitors 141a, 141b is achieved using CMOS transistors. Using die area of a CMOS die to implement capacitors 141a, 141b can permit a reduction in the number of components needed to form the power amplifier module.

When the switch 150 is in an ON state, the capacitors 141a, 141b can be in series and have a corresponding series capacitance. Thus, the capacitors 141a, 141b can be sized to achieve a desired capacitance. Furthermore, the capacitors 141b can be used to isolate the DC voltage of the output of the switch 150. This permits the bias block 142 to establish the DC potential at the input of the switch 150. In one embodiment, the first capacitor 141a has a capacitance ranging between about 4 pF to about 5 pF, and the second capacitor 141b has a capacitance ranging between about 4 pF to about 5 pF.

Figure 10:
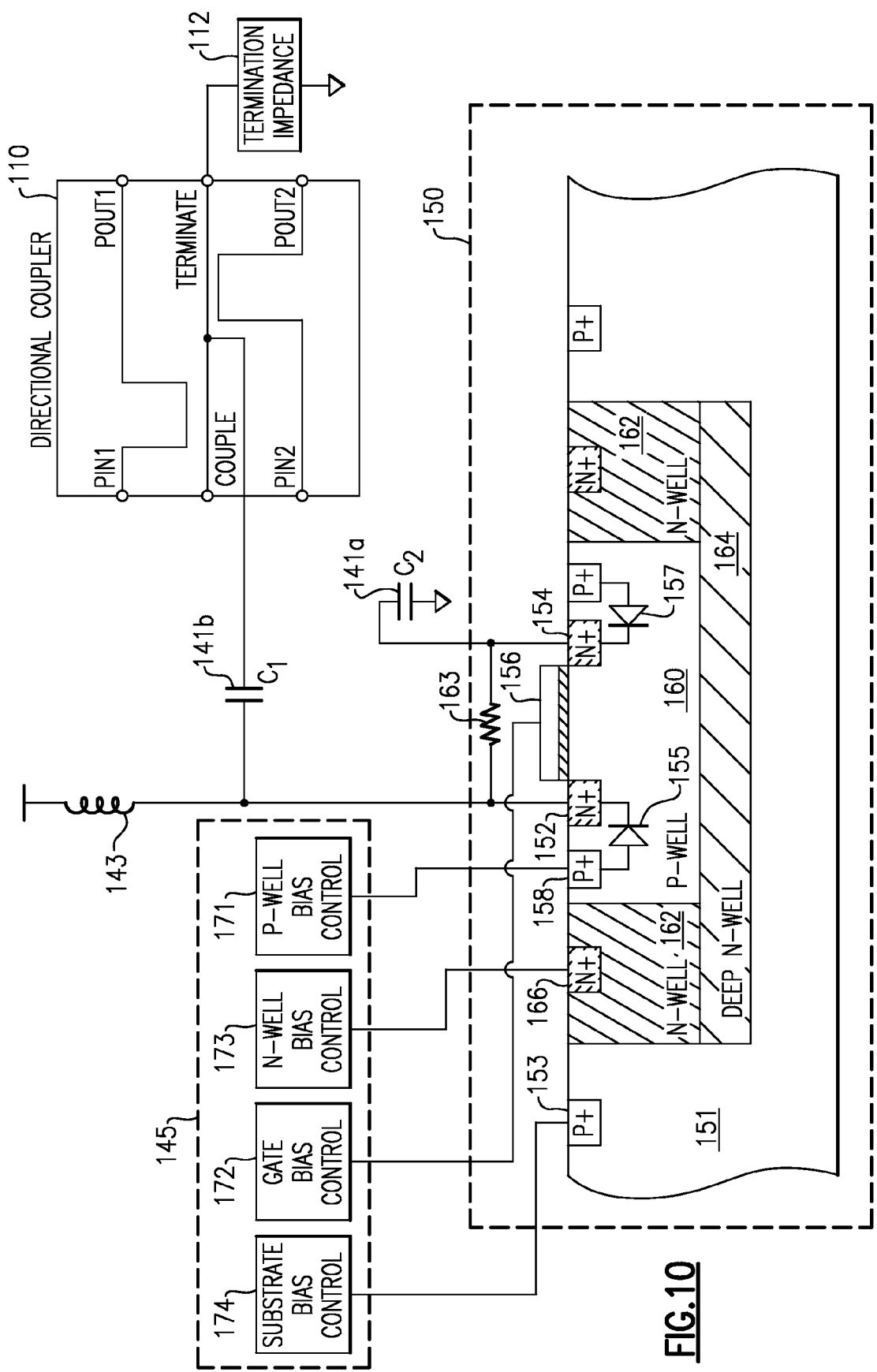
FIG. 10 is a schematic diagram of a directional coupler having configurable termination impedance in accordance with another embodiment.

FIG. 10 is a schematic diagram of a directional coupler having configurable termination impedance in accordance with another embodiment. The directional coupler 110 includes a PIN1 terminal, a POUT1 terminal, a PIN2 terminal, a POUT2 terminal, a COUPLE terminal and a TERMINATE terminal as described above. The TERMINATE terminal can be electrically connected to the termination impedance 112. The switch 150 can be used to selectively include the series combination of the first and second capacitors 141a, 141b in parallel with the termination impedance 112, as will be described below.

The switch 150 includes a substrate 151, substrate contacts 153, a p-well 160, p-well contacts 158, n-wells 162, deep n-well 164, n-well contacts 166, a source 152, a drain 154, a gate 156, and a resistor 163. The switch 150 can be a triple well CMOS switch. Furthermore, the switch 150 can include a resistor 163 having a first end electrically connected to the source 152, and a second end electrically connected to the drain 154. The resistor 163 can be implemented in any suitable manner, including, for example, using a polysilicon or n-diffusion layer having a length and width selected to achieve a desired resistance. Additional details of the switch 150 can be similar to those described above with reference to FIG. 6.

The switch 150 has been annotated to show certain parasitic diode devices formed from the illustrated switch layout structure, including diodes 155, 157. The diode 155 includes an anode formed from the p-well 160, and a cathode formed from the source 152. The diode 157 includes an anode formed from the p-well 160 and a cathode formed from the drain 154.

The switch bias control system 145 and inductor 143 can be used to bias the switch 150 to prevent unintended activation of the diodes 155, 157. For example, the p-well bias control block 171 can provide a p-well bias voltage to the p-well 160 of the switch 150, and the p-substrate bias control block 174 can provide a bias voltage to the substrate 151. Furthermore, the gate bias control block 172 can provide a gate bias voltage to the gate 156 of the switch 150, and the n-well bias control block 173 can provide an n-well bias voltage to the n-well 162 of the switch 150. Additionally, the inductor 143 can be used to establish the DC potential of the source 152. The inclusion of the resistor 163 can aid in substantially matching the DC bias voltage of the drain 154 to that of the source 154, even when the gate 156 is configured to bias the switch 150 in an OFF condition.

The first capacitor 141a includes a first end electrically connected to a reference potential, and a second end electrically connected to the drain 154 of the switch 150. The second capacitor 141b includes a first end electrically connected to the source 152 of the switch and to a first end of the inductor 143, and a second end electrically connected to the directional coupler 110. The second end of the capacitor 141b can be electrically connected between the COUPLE and TERMINATE terminals of the directional coupler 110. However, the second end of the capacitor 141b can also be electrically connected directly to the TERMINATE terminal of the directional coupler 110.

The bias control blocks 171-174 can be used to bias the switch 150 in the ON and OFF states. For example, the substrate bias control block 174 can be configured to bias the substrate 151 at a ground potential in both the ON and OFF states of the switch 150. Additionally, the n-well bias control block 153 can be configured to bias the n-wells 162 and deep n-well 164 at a relatively high voltage. The p-well bias control block 171 and the gate bias control block 172 can be configured to bias the p-well 160 and gate 156, respectively, to a relatively low voltage during the OFF state of the switch 150. This can permit lifetime of the RF switch 150 to be extended by avoiding high-voltage gate-body and gate-diffusion stress conditions. During the ON state of the switch 150, the p-well bias control block 171 can be configured to increase the voltage of the p-well 160 to be equal to about the bias voltage provided by the inductor 143 to the source 152. Additionally, the gate bias control block 172 can be configured to increase the voltage of the gate 156 above the voltage of the p-well 160 so at to turn on the gate 156.

The bias control blocks 171-174 can be implemented by using, for example, a power or ground supply and/or a voltage regulator, such as a charge pump. For example, the substrate bias control block 174 can be a ground supply. Additionally, the gate bias control block can include one or more charge pumps for establishing the desired gate voltages during the ON and OFF states of the switch 150.

Selectively including the series combination of the capacitors 141a, 141b in parallel with the termination impedance 112 can aid in improved directivity across frequency bands of operation. This permits the termination impedance 112 to be designed for operating in a first frequency band, and allows the capacitors 141a, 141b to be included when operating in a second frequency band. Having a particular impedance for a particular frequency band can improve the directivity of the directional coupler 110, which can aid in improving, for example, the accuracy of reflected power measurements made using the COUPLE terminal.

Figure 11:
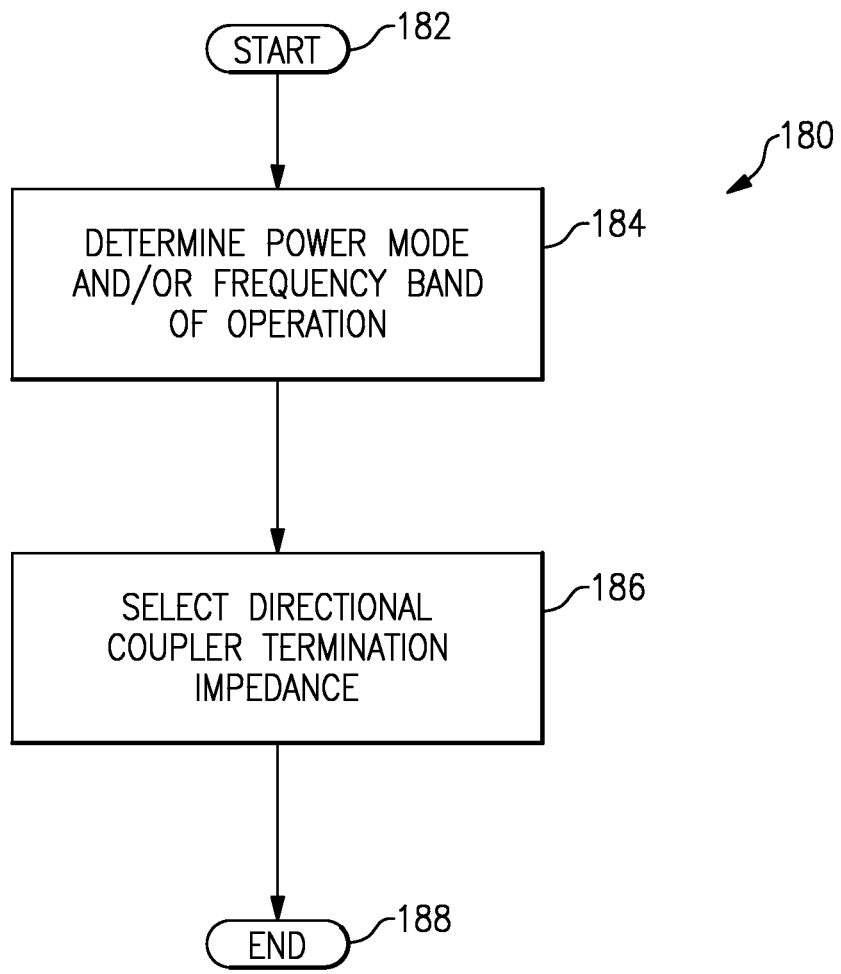
FIG. 11 is a method of configuring the termination impedance of a directional coupler in accordance with one embodiment.

FIG. 11 is a method of configuring the termination impedance of a directional coupler in accordance with one embodiment. The method 180 is depicted from the point of view of a power amplifier module. It will be understood that the methods discussed herein may include greater or fewer operations and the operations may be performed in any order, as necessary. The illustrated method can be used to configure the impedance of, for example, the directional couplers illustrated in FIGS. 7-10.

The method 180 for configuring the termination impedance of a directional coupler starts at 182. In an ensuing block 184, one or more of a power mode and/or a frequency band of operation is determined. For example, a power amplifier module can have a directional coupler connected to RF signal pathways associated with different frequency bands of operation. Additionally, a power amplifier module can include a plurality of power amplifiers which are selectively included or excluded into the active RF pathway based on a power mode. By determining the current power mode and/or a frequency band of operation, a desired termination impedance for a directional coupler can be determined.

In an ensuing block 186, the directional coupler termination impedance is selected based at least partly upon the power mode and/or frequency band of operation determined in block 184. For example, termination impedance which is an optimum for one particular frequency band or power mode may not be optimum for another frequency band or power mode. Thus, in block 186, a switch can be used to select a termination impedance so as to increase directivity for a particular frequency band and/or power mode. In one embodiment, a CMOS switch is used. However, in certain embodiments, other switches can be used, including, for example, bipolar switches, BiCMOS switches, or switches built using silicon-on-insulator (SOI) technologies. The method ends at 194.

Applications

Some of the embodiments described above have provided examples in connection with mobile phones. However, the principles and advantages of the embodiments can be used for any other systems or apparatus that have needs for directional couplers.

Such directional couplers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for termination impedance selection in a power amplifier module, the method comprising:
   generating a first radio frequency signal using a first power amplifier of the power amplifier module;
   generating a second radio frequency signal using a second power amplifier of the power amplifier module;
   determining at least one of a power mode or a frequency band of operation of the power amplifier module, the power amplifier module including a multi-band directional coupler including a first signal pathway associated with the first radio frequency signal and a second signal pathway associated with the second radio frequency signal; and
   selecting a termination impedance of the multi-band directional coupler based on the determination using at least one switch, the at least one switch including a first switch electrically connected in series with a first capacitor and a second capacitor between a terminate terminal of the multi-band directional coupler and a reference voltage.

2. The method of claim 1 wherein the multi-band directional coupler further includes a first power input terminal, a first power output terminal, a second power input terminal, a second power output terminal, and a couple terminal, the first power input terminal configured to receive the first radio frequency signal from the first power amplifier, the second power input terminal configured to receive the second radio frequency signal from the second power amplifier, the first power output terminal electrically connected to a first load, the second power output terminal electrically connected to a second load, and the couple terminal electrically connected to the terminate terminal.

3. The method of claim 1 further comprising measuring a power of the first radio frequency signal using the multi-band directional coupler, and measuring a power of the second radio frequency signal using the multi-band directional coupler.

4. The method of claim 1 wherein the first capacitor includes a first end electrically connected to the reference voltage and a second end electrically connected to an output of the first switch, the second capacitor including a first end electrically connected to an input of the first switch and a second end electrically connected to a couple terminal of the multi-band direction coupler and to the terminate terminal of the multi-band directional coupler.

5. The method of claim 1 further comprising controlling a DC potential at an input of the first switch using a bias block.

6. A method for termination impedance selection of a directional coupler in a power amplifier module, the method comprising:
   determining at least one of a power mode or a frequency band of operation of the power amplifier module;
   selecting a termination impedance of the directional coupler based on the determination using at least one switch, the at least one switch including a first switch having an ON state and an OFF state, the first switch including an input electrically connected to a terminate terminal of the directional coupler and an output electrically connected to a first termination impedance, the first switch configured to provide a first low impedance path between the input and the output when in the ON state and to provide a first high impedance path between the input and the output when in the OFF state, the first high impedance path having an impedance that is greater than an impedance of the first low impedance path.

7. The method of claim 6 wherein the at least one switch further includes a second switch having an ON state and an OFF state, the second switch including an input electrically connected to the terminate terminal of the directional coupler and an output electrically connected to a second termination impedance, the second switch configured to provide a second low impedance path between the input of the second switch and the output of the second switch when in the ON state and to provide a second high impedance path between the input of the second switch and the output of the second switch when in the OFF state, the second high impedance path having an impedance that is greater than an impedance of the second low impedance path.

8. The method of claim 6 wherein selecting the termination impedance includes selecting a termination resistor.

9. The method of claim 6 wherein selecting the termination impedance includes using a CMOS switch.

10. The method of claim 9 wherein selecting the termination impedance includes selecting a capacitor.

11. The method of claim 9 further comprising biasing the CMOS switch using an inductor.

12. The method of claim 6 wherein selecting the termination impedance includes using at least two switches.

13. The method of claim 6 wherein determining at least one of the power mode or the frequency band of operation of the power amplifier module includes determining the power mode of the power amplifier module.

14. The method of claim 6 wherein determining at least one of the power mode and the frequency band of operation of the power amplifier module includes determining the frequency band of operation of the power amplifier module.

15. The method of claim 6 wherein determining at least one of the power mode or the frequency band of operation of the power amplifier module includes determining both the power mode of the power amplifier module and the frequency band of operation of the power amplifier module.

16. A non-transitory tangible computer-readable storage medium comprising instructions that when executed by a processor perform a method for termination impedance selection in a power amplifier module, the method comprising:
    determining at least one of a power mode or a frequency band of operation of the power amplifier module, the power amplifier module including a first power amplifier configured to generate a first radio frequency signal and a second power amplifier configured to generate a second radio frequency signal, the power amplifier module further including a multi-band directional coupler including a first signal pathway associated with the first radio frequency signal and a second signal pathway associated with the second radio frequency signal; and
    generating a switch control signal based on the determination, the switch control signal operable to select a termination impedance of the multi-band directional coupler using at least one switch, the switch control signal further operable to turn on or off a first switch of the at least one switch, the first switch electrically connected in series with a first capacitor and a second capacitor between a terminate terminal of the multi-band directional coupler and a reference voltage.

17. The non-transitory tangible computer-readable storage medium of claim 16 wherein determining at least one of the power mode or the frequency band of operation of the power amplifier module includes determining the power mode of the power amplifier module.

18. The non-transitory tangible computer-readable storage medium of claim 16 wherein determining at least one of the power mode and the frequency band of operation of the power amplifier module includes determining the frequency band of operation of the power amplifier module.

19. The non-transitory tangible computer-readable storage medium of claim 16 wherein determining at least one of the power mode or the frequency band of operation of the power amplifier module includes determining both the power mode of the power amplifier module and the frequency band of operation of the power amplifier module.

20. The non-transitory tangible computer-readable storage medium of claim 16 wherein the switch control signal is operable to control a plurality of switches to select the termination impedance of the multi-band directional coupler.

* * * * *